（12）United States Patent
Rahimo et al.

(10) Patent No.: US 8,501,586 B2
(45) Date of Patent: Aug. 6, 2013

(54) POWER SEMICONDUCTOR

(75) Inventors: Munaf Rahimo, Uezwil (CH); Arnost Kopta, Zürich (CH); Stefan Linder, Zofingen (CH)

(73) Assignee: ABB Technology AG, Zurich (CH)

( * ) Notice: Subject to any disclaimer, the term of this patent is extended or adjusted under 35 U.S.C. 154(b) by 1264 days.

(21) Appl. No.: 11/812,030

(22) Filed: Jun. 14, 2007

(65) Prior Publication Data

US 2007/0281442 A1 Dec. 6, 2007

Related U.S. Application Data

(63) Continuation of application No. PCT/CH2005/000737, filed on Dec. 9, 2005.

(30) Foreign Application Priority Data

Dec. 16, 2004 (EP) .................................... 04405775

(51) Int. Cl.
*H01L 21/30* (2006.01)
*H01L 21/46* (2006.01)

(52) U.S. Cl.
USPC .................... 438/459; 257/492; 257/E21.135

(58) Field of Classification Search
USPC ............ 438/459; 257/492, E21.135, E29.002
See application file for complete search history.

(56) References Cited

FOREIGN PATENT DOCUMENTS

EP 0 657 941 A2 6/1995
EP 1 237 200 A2 9/2002

OTHER PUBLICATIONS

J.Yamashita et al., "A Novel Effective Switching Loss Estimation of Non-Punchthrough and Punchthrough IGBTs", IEEE, pp. 109-111, 1997.
PCT/ISA/210.
PCT/ISA/237.
European Search Report.

*Primary Examiner* — Tony Tran
(74) *Attorney, Agent, or Firm* — Buchanan Ingersoll & Rooney PC

(57) ABSTRACT

In order to produce a power semiconductor for operation at high blocking voltages, there is produced on a lightly doped layer having a doping of a first charge carrier type a medium-doped layer of the same charge carrier type. A highly doped layer is produced at that side of the medium-doped layer which is remote from the lightly doped layer, of which highly doped layer a part with high doping that remains in the finished semiconductor forms a second stop layer, wherein the doping of the highly doped layer is higher than the doping of the medium-doped layer. An electrode is subsequently indiffused into the highly doped layer. The part with low doping that remains in the finished semiconductor forms the drift layer and the remaining medium-doped part forms the first stop layer.

11 Claims, 3 Drawing Sheets

US 8,501,586 B2

POWER SEMICONDUCTOR

TECHNICAL FIELD

The invention relates to the field of power electronics. It relates to a method for producing a power semiconductor for operation at high blocking voltages.

BACKGROUND INFORMATION

In non-punch-through (NPT) insulated gate bipolar transistors (IGBTs) such as are described for example in the document by J. Yamashita et al. (IEEE 1997, pp. 109-112), a lightly doped drift layer of a first charge carrier type directly adjoins the electrode of a second charge carrier type. These IGBTs are distinguished by the fact that the drift layer, for taking up a high blocking voltage, has a larger thickness and higher doping in comparison with the punch-through (PT) IGBTs described below. Owing to the larger thickness of the drift layer, higher losses are generated in the IGBT. In the case of a fault, a short-circuit current with short current spike can occur during the turn-on of the IGBT, or short-circuit current pulses can occur during operation in the turned-on state of the IGBT. On account of such a short-circuit current, the IGBT can lose its gate control and the current can continue to rise through to the destruction of the IGBT. In the case of NPT IGBTs it is advantageous that the electrode injection efficiency can be kept low without adversely influencing the robustness of the IGBT under short-circuit conditions.

In the case of punch-through (PT) IGBTs a highly doped stop layer of the first charge carrier type is introduced between the drift layer and the electrode, whereby it becomes possible to use thinner drift layers at the same blocking voltages in comparison with NPT IGBTs. The resistance is thereby reduced and lower losses occur in the turned-on IGBT as well as during the switching of the IGBT. However, the robustness of the PT IGBTs under short-circuit conditions is poorer than in the case of the NPT IGBTs.

In order to combine the advantages of PT IGBTs with those of NPT IGBTs, soft-punch-through (SPT) IGBTs have been developed, the stop layer of which, although more highly doped than the drift layer, is more lightly doped than the stop layer of a PT IGBT. The stop layer is produced by particles of the first charge carrier type being indiffused deep into a layer of the same charge carrier type. Stop layers produced in this way have a thickness of 5-60 µm. In order to drive the particles deep into the layer, long diffusion times are required. As a result, defects which can considerably reduce the blocking voltage are produced in the layer.

The document EP 1 237 200 describes a method for producing power semiconductors for operation at low blocking voltages up to 600 V. A 25 to 60 µm thin (n−)-doped drift layer is grown epitaxially on an n-doped, 625 µm thick first stop layer. The emitter is then produced and the n-doped layer is subsequently trimmed to a remaining part, such that the total thickness of the wafer from the emitter to the n-doped layer is 60 to 80 µm. A second, (n+) doped stop layer is produced by diffusion in the n-doped layer at the side at which the layer was trimmed, and an anode is formed at this side. In order to produce the second stop layer, the wafer is exposed to high temperatures as a result of the diffusion method, which is problematic for the emitter produced beforehand. Through the introduction of the second stop layer, the anode injection and the punch-through are controlled in semiconductors having low blocking voltages. This method is only suitable for producing power semiconductors for operation at low blocking voltages because the drift layer is thin in semiconductors of this type, and so the method for producing the drift layer by means of epitaxial growth is still economically tenable.

SUMMARY

It is an object of the invention to specify a method for producing a power semiconductor for operation at high blocking voltages, preferably an IGBT, which has a higher robustness under short-circuit conditions (improved "short-circuit safe operating area", SCSOA for short) in conjunction with reduced losses, leakage currents and defects.

A high-voltage power semiconductor for operation at high blocking voltages, in particular at blocking voltages above 2000 V, that is produced by the method according to the invention comprises a drift layer (2) having a doping of a first charge carrier type, a first stop layer (3) having a doping of the first charge carrier type, and an electrode (5) of a second charge carrier type, wherein the doping of the first stop layer (3) is higher than the doping of the drift layer (2).

In the method according to the invention, proceeding from a lightly doped layer (6) of a first charge carrier type, of which lightly doped layer (6) a part with low doping that remains in the finished semiconductor forms the drift layer (2), a medium-doped layer (7) is produced at one side of the lightly doped layer. Of the medium-doped layer (7), a part with medium doping that remains in the finished semiconductor forms the first stop layer (3). The electrode (5) is then indiffused into that layer of the first charge carrier type which has the highest doping of the layers of the first charge carrier type. The method according to the invention is characterized in that after the production of the medium-doped layer (7) and before the production of the electrode (5), at that side of the medium-doped layer (7) which is remote from the lightly doped layer (6), a highly doped layer (8) is produced. Of the highly doped layer (8), a part with high doping that remains in the finished semiconductor forms a second stop layer (4). The doping of the highly doped layer (8) is higher than the doping of the medium-doped layer (7). The electric field is reduced in the first stop layer. The second stop layer brings about a reduction of leakage currents.

Further advantageous configurations of the invention are specified in the subclaims.

BRIEF DESCRIPTION OF THE DRAWINGS

The method according to the invention and the subject matter of the invention are explained in more detail below on the basis of preferred exemplary embodiments illustrated in the accompanying drawings, in which:

FIG. 2 diffusion method;

FIG. 3 epitaxial growth

FIG. 4 epitaxial growth, combined with diffusion method;

FIG. 5 diffusion method, combined with bonding and cutting;

DETAILED DESCRIPTION

Figure 1:
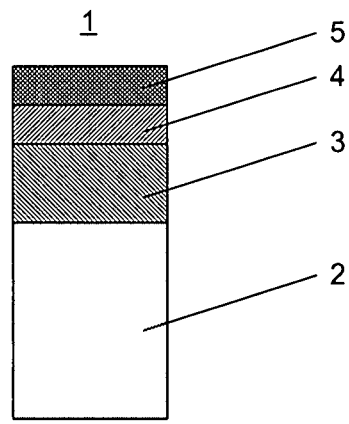
FIG. 1 shows a section through a power semiconductor according to the invention.

The power semiconductor 1 according to the invention that is illustrated in FIG. 1 comprises a doped drift layer 2 of a first charge carrier type, on which is arranged a first stop layer 3 of the first charge carrier type having a higher doping. Arranged on the first stop layer is a second stop layer 4 of the first charge carrier type, which is more highly doped than the first stop layer 3. An electrode 5 of a second charge carrier type adjoins the second stop layer. The drift layer 2 is referred to hereinafter as being lightly doped, which should be understood to mean that the drift layer is more lightly doped than the first stop layer 3 and the second stop layer 4. The first stop layer 3 is referred to as being medium-doped, which should be understood to mean that the first stop layer 3 is more highly doped than the drift layer 2, but more lightly doped than the second stop layer 4. The second stop layer 4 is referred to as being highly doped, which should be understood to mean that the second stop layer 4 is more highly doped than the drift layer 2 and the first stop layer 3.

For application at high blocking voltages, the drift layer 2 typically has a thickness of more than 150 μm and a doping of less than $5*10^{13}/cm^3$. High blocking voltages should be understood to mean, in particular, voltages that are higher than 2000 V.

In one embodiment, the first stop layer 3 of the power semiconductor 1 has a thickness of (10-30) μm and/or a doping of $10^{13}-2*10^{15}/cm^3$ in the region of the surface. With such a design of the first stop layer 3, it is possible to reduce the electric field in the blocking state before it penetrates into the vicinity of the electrode 5. The region between the end of the electric field and the electrode 5 is the base of the IGBT-internal bipolar transistor. By means of a first stop layer 3 formed in this way, said region is enlarged and the leakage current in the blocking state is reduced. With such a low doping, however, it is simultaneously possible to achieve a large SCSOA.

The second stop layer 4 has a thickness of (1-10) μm and/or a doping of $2*10^{15}-10^{17}/cm^3$ in the region of the surface. With such a high doping, the electrode injection efficiency can be kept low with low injection of the electrode 5 and it is thus possible to achieve low leakage currents in the blocking state. The SCSOA is not reduced with such a small thickness of the second stop layer 4.

The electrode 5 is formed as a transparent electrode in one embodiment. Said electrode is produced by a diffusion method, wherein firstly an implantation of particles with a dose of $(10^{13}-10^{16})/cm^2$ and then an activation are performed. The thickness of the electrode 5 is less than 5 μm. The diffusion method is described below.

The layers of a power semiconductor 1 can be produced by a diffusion method and/or epitaxial growth. In addition, layers can be connected to one another by bonding and the thickness of a layer can be reduced by cutting. The methods are explained briefly below.

Figure 2:
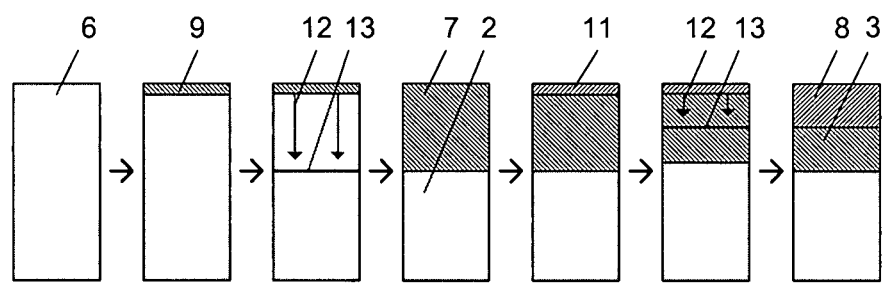
FIG. 2 TO 5 show method steps for producing the power semiconductor according to FIG. 1 from the starting material to a stage at which a drift layer is connected to a first and a second stop layer using the following methods.

The diffusion method is carried out by implanting into a layer doped with one charge carrier type particles of the same or another charge carrier type. In FIG. 2, particles for creating a first stop layer 3 are implanted for example in a lightly doped layer 6. The implanted particles are represented by the reference symbol 9. An activation is subsequently effected by the implanted particles 9 being indiffused into the lightly doped layer 6 to a predetermined depth 13 by heating the layer. The diffusion of the implanted particles is represented by the arrows provided with the reference symbol 12 in FIG. 2. The higher the temperature is chosen and the longer the heating process is carried out, the deeper the particles are driven into the layer. In order to create a first stop layer 3, typically particles of a first charge carrier type 9 are implanted and driven in with long heating times and high temperatures. In order to create a second stop layer 4, particles of a first charge carrier type are implanted and the implanted particles 10 are typically driven in over a short time and at a low temperature. The electrode 5 is produced by implantation of particles of a second charge carrier type 11 and diffusion with very short times and low temperatures.

Epitaxial growth is understood to mean a method in which a semiconductor layer is exposed to high temperatures in a gas environment. Particles deposit from the gas on the surface of the layer, and a layer is formed.

Two semiconductor layers are connected to one another during bonding by said layers being exposed to high temperatures. It is possible to use binders between the layers in order to improve the binding.

During the cutting of a semiconductor layer, the thickness of the layer is typically reduced by grinding away, polishing and/or etching.

The description below will only discuss the method steps by which the stop layers 3, 4 of the power semiconductor 1 are created. Further method steps for producing a power semiconductor 1 such as the application of metallizations or insulations, for example, are not discussed. After the application of a metallization, the power semiconductor should for example no longer be exposed to high temperatures that would damage the metallization. Therefore, these method steps should be carried out at a point in time such that in subsequent method steps the power semiconductor is no longer exposed to conditions such as excessively high temperatures, for example as a result of a diffusion method for forming the first and/or second stop layer, which lead to damage to the semiconductor. As an alternative, the stop layers 3, 4 can also be produced with the aid of rapidly diffusing dopants. As a result, these two layers can be indiffused at the end of the method at low temperatures.

On the electrode side denotes that side of a layer which faces the electrode 5 in the finished power semiconductor 1.

FIG. 2 illustrates a method for producing a power semiconductor 1 in which, proceeding from a lightly doped layer 6 of a first charge carrier type, the stop layers 3, 4 are produced by means of diffusion methods. In order to form the first stop layer 3, particles of the first charge carrier type 9 are implanted into a lightly doped layer 6 of a first charge carrier type on the electrode side and are subsequently driven in to a predetermined depth 13. The diffusion of implanted particles into the layer is represented by arrows having the reference symbol 12 in the figure. A medium-doped layer 7 is produced as a result. The then remaining lightly doped part of the layer forms the drift layer 2 in the finished power semiconductor 1. In order to form the second stop layer 4, particles of the first charge carrier type 10 are subsequently implanted into the medium-doped layer 7 on the electrode side and are subsequently driven in to a predetermined depth 13, said depth being less than the depth to which the particles 9 were driven in for forming the first stop layer 3. A highly doped layer 8 is produced by this drive-in. The then remaining medium-doped part of the layer forms the first stop layer 3 in the finished power semiconductor 1. A thick lightly doped layer 6 of the first charge carrier type is advantageously used in the production of the power semiconductor 1, said layer affording mechanical robustness during the individual steps of the production method. This method can therefore be used advantageously to produce power semiconductors 1 for application at high blocking voltages since such power semiconductors 1 have a thick drift layer 2 for taking up the high voltages. The power semiconductors 1 produced by this method can be produced cost-effectively by the two diffusion methods. The stop layers 3, 4 are formed in the manner illustrated in FIG. 2 and described above, the stop layers 3, 4 being produced by means of rapidly diffusing dopants at low temperatures. The then remaining lightly doped part of the layer 6 forms the drift layer 2 in the finished power semiconductor 1. The stop layers 3, 4 are produced by means of rapidly diffusing dopants since the latter do not require high temperatures in order to indiffuse into the lightly doped layer 6. The stop layers 3, 4 can therefore be produced without the almost finished power semiconductor 1 having to be exposed to high temperatures.

Figure 3:
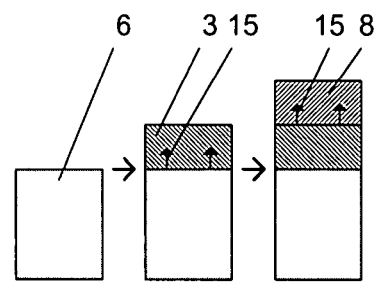

FIG. 3 illustrates a method for producing a power semiconductor 1 in which, proceeding from a lightly doped layer 6, the stop layers 3, 4 are produced by means of epitaxial growth. A first stop layer 3 is produced by epitaxial growth on a lightly doped layer 6, which corresponds to the drift layer 2 in the finished power semiconductor 1. The epitaxial growth is represented by arrows having the reference symbol 15 in the figure. A highly doped layer 8 is subsequently produced on the first stop layer 3 on the electrode side by epitaxial growth in order to form the second stop layer 4. A thick lightly doped layer 6 can advantageously be used during this production method because it affords mechanical robustness during the individual steps of the production method. The method can therefore be advantageously used to produce power semiconductors 1 for application at high blocking voltages since power semiconductors 1 of this type require a thick drift layer 2 for taking up the high voltages. The stop layers 3, 4 produced by epitaxial growth have a uniform doping over the entire thickness up to and including the boundaries of the layers.

Figure 4:
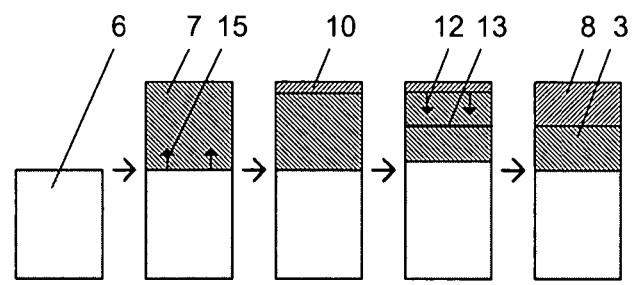

FIG. 4 illustrates a method for producing a power semiconductor 1 in which, proceeding from a lightly doped layer 6, the first stop layer 3 is produced by means of a diffusion method and the second stop layer 4 is produced by means of epitaxial growth. A medium-doped layer 7 is produced by epitaxial growth 15 on a lightly doped layer 6, which corresponds to the drift layer 2 in the finished power semiconductor 1. In order to form the second stop layer 4, particles of the first charge carrier type 10 are subsequently implanted into the medium-doped layer 7 on the electrode side and are subsequently driven in to a predetermined depth 13, said depth 13 being less than the thickness of the medium-doped layer 7. A highly doped layer 8 is produced by this drive-in. The then remaining medium-doped part of the layer forms the first stop layer 3 in the finished power semiconductor 1. A thick lightly doped layer 6 can advantageously be used during this production method because it affords mechanical robustness during the individual steps of the production method. The method can therefore be advantageously used to produce power semiconductors 1 for application at high blocking voltages since such power semiconductors 1 require a thick drift layer 2 for taking up the high voltages. The second stop layer 4 produced by means of epitaxial growth has a uniform doping over the entire thickness up to and including the boundaries of the layer.

Figure 5:
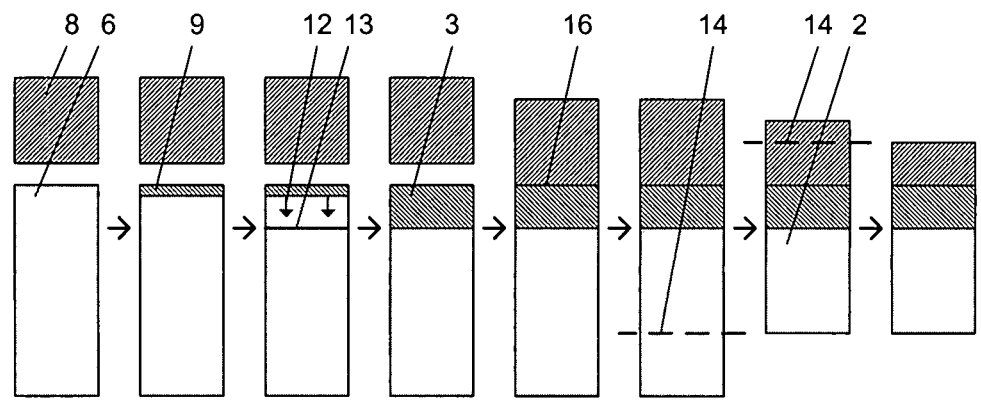

FIG. 5 illustrates a method for producing a power semiconductor 1 in which, proceeding from a lightly doped layer 6, a first stop layer 3 is produced by means of a diffusion method. In order to form the first stop layer 3, particles of the first charge carrier type 9 are implanted into the lightly doped layer 6 of a first charge carrier type on the electrode side and are subsequently driven in to a predetermined depth 13. The diffusion of implanted particles into the layer is represented by arrows having the reference symbol 12 in FIG. 5. A first stop layer 3, which is medium-doped, is thereby produced. The layer 6 is subsequently connected to a highly doped layer 8 by bonding 16, the first stop layer 3 being embedded between the lightly doped layer 6 and the highly doped layer 8. A part of the lightly doped layer 6 is trimmed on the side remote from the electrode side, and the remaining lightly doped region of the layer forms the drift layer 2. At the end of the method, a part of the highly doped layer 8 is trimmed on the electrode side since the mechanical stability is no longer required. Use is advantageously made of a thick highly doped layer 8 which affords sufficient mechanical stability during the steps of the method for producing the power semiconductor 1.

Figure 6:
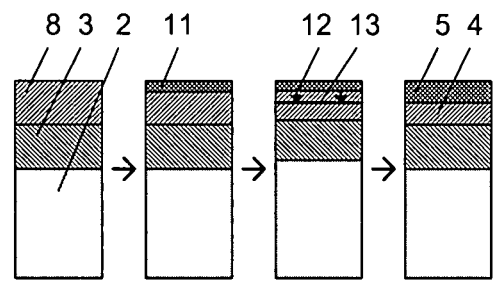
FIG. 6 shows method steps for producing the power semiconductor according to FIG. 1 from the end stage in accordance with one of FIGS. 2 to 5 to the stage at which the electrode is additionally introduced.

FIG. 6 proceeds from the end product from the production methods according to one of FIGS. 2 to 5. In this case, there is arranged on a lightly doped drift layer 2 of a first charge carrier type a more highly doped first stop layer 3 of the first charge carrier type, on which is arranged, in turn, a highly doped layer 8 of the first charge carrier type. In order to form the electrode 5, particles of the second charge carrier type 11 are diffused into the highly doped layer 8 to a predetermined depth 13 on the electrode side. The then remaining highly doped part of the layer of the first charge carrier type forms the second stop layer 4 in the finished power semiconductor 1.

LIST OF REFERENCE SYMBOLS

1 Power semiconductor
2 Drift layer
3 First stop layer
4 Second stop layer
5 Electrode
6 Lightly doped layer
7 Medium-doped layer
8 Highly doped layer
9 Particles for creating a first stop layer
10 Particles for creating a second stop layer
11 Particles for creating an electrode
12 Diffusion of implanted particles
13 Depth to which particles are driven into the layer
14 Cut through semiconductor layer
15 Epitaxial growth
16 Bonding

What is claimed is:

1. A method for producing a high-voltage power semiconductor for operation at high blocking voltages of greater than 2000 V comprising a drift layer having a doping of a first charge carrier type, a first stop layer having a doping of the first charge carrier type, and an electrode of a second charge carrier type, wherein the doping of the first stop layer is higher than the doping of the drift layer the method for producing the power semiconductor comprising:

proceeding from a lightly doped layer of a first charge carrier type, a medium-doped layer is produced at one side of the lightly doped layer to form the first stop layer, and the remaining part of the lightly doped layer forms the drift layer; and indiffusing the electrode is into one of the drift layer and first stop layer, which has the highest doping of the layers of the first charge carrier type, wherein after the production of the medium-doped layer and before the production of the electrode, at a side of the medium-doped layer which is remote from the lightly doped layer, producing a highly doped layer to form a second stop layer, wherein the doping of the highly doped layer is higher than the doping of the medium-doped layer, and metallizations are applied after the indiffusion of the electrode.

2. The method as claimed in claim 1, wherein in order to form the first stop layer, particles of the first charge carrier type are implanted into the lightly doped layer and are driven in to a depth that is less than the depth of the lightly doped layer.

3. The method as claimed in claim 2, wherein in order to form the second stop layer, the medium-doped layer together with a highly doped layer are connected to one another by bonding.

4. The method as claimed in claim 3, wherein the highly doped layer is thinned in order to form the second stop layer.

5. The method as claimed in claim 1, wherein in order to form the first stop layer on the lightly doped layer, a medium-doped layer is produced by epitaxial growth.

6. The method as claimed in claim 5, wherein in order to form the second stop layer, particles of the first charge carrier type are implanted into the medium-doped layer and are driven in to a depth that is less than the depth of the medium-doped layer.

7. The method as claimed in claim 5, wherein in order to form the second stop layer, the medium-doped layer together with a highly doped layer are connected to one another by bonding.

8. The method as claimed in claim 1, wherein in order to form the second stop layer, particles of the first charge carrier type are implanted into the medium-doped layer and are driven in to a depth that is less than the depth of the medium-doped layer.

9. The method of claim 1, wherein the drift layer is formed to a thickness of at least 150 μm.

10. The method of claim 1, wherein the first stop layer is formed to a thickness of at least 10 μm.

11. The method of claim 1, wherein the second stop is formed to a thickness of at least 1 μm.

* * * * *